United States Patent
Glass et al.

(10) Patent No.: US 11,232,948 B2
(45) Date of Patent: Jan. 25, 2022

(54) LAYERED SUBSTRATE FOR MICROELECTRONIC DEVICES

(71) Applicant: INTEL CORPORATION, Santa Clara, CA (US)

(72) Inventors: Glenn A. Glass, Portland, OR (US); Anand S. Murthy, Portland, OR (US)

(73) Assignee: Intel Corporation, Santa Clara, CA (US)

(*) Notice: Subject to any disclaimer, the term of this patent is extended or adjusted under 35 U.S.C. 154(b) by 544 days.

(21) Appl. No.: 16/074,350

(22) PCT Filed: Apr. 1, 2016

(86) PCT No.: PCT/US2016/025723
§ 371 (c)(1),
(2) Date: Jul. 31, 2018

(87) PCT Pub. No.: WO2017/171872
PCT Pub. Date: Oct. 5, 2017

(65) Prior Publication Data
US 2020/0258738 A1 Aug. 13, 2020

(51) Int. Cl.
*H01L 21/02* (2006.01)
*H01L 21/84* (2006.01)
*H01L 29/78* (2006.01)

(52) U.S. Cl.
CPC .. *H01L 21/02378* (2013.01); *H01L 21/02376* (2013.01); *H01L 21/02447* (2013.01); *H01L 21/02488* (2013.01); *H01L 21/02587* (2013.01); *H01L 21/845* (2013.01); *H01L 29/78* (2013.01)

(58) Field of Classification Search
None
See application file for complete search history.

(56) References Cited

U.S. PATENT DOCUMENTS

| | | |
|---|---|---|
| 5,705,262 A | 1/1998 | Bou et al. |
| 2006/0096946 A1* | 5/2006 | Schaepkens ...... H01L 21/67109 216/13 |
| 2007/0138601 A1 | 6/2007 | Fan et al. |
| 2012/0168802 A1 | 7/2012 | Hirotsuru et al. |
| 2013/0330886 A1 | 12/2013 | Huang et al. |
| 2015/0171045 A1 | 6/2015 | Berger et al. |
| 2015/0221499 A1* | 8/2015 | Park .................. H01L 21/0228 257/29 |
| 2016/0141275 A1* | 5/2016 | Bono .................. H01L 23/36 257/706 |
| 2016/0225856 A1* | 8/2016 | Berger ............... H01L 29/1075 |
| 2017/0018614 A1* | 1/2017 | Rupp ................ H01L 21/02494 |

OTHER PUBLICATIONS

PCT/US2016/025723, Notification of Transmittal of the International Search Report and Written Opinion, dated Dec. 28, 2016, 15 pages.

* cited by examiner

*Primary Examiner* — Alexander G Ghyka
(74) *Attorney, Agent, or Firm* — Schwabe, Williamson & Wyatt, P.C.

(57) ABSTRACT

The present disclosure provides systems and methods for a layered substrate. A layered substrate may include a core comprising graphite. The layered substrate may also include a coating layer comprising a coating material that surrounds the core, wherein the coating material has a melting point that is greater than a melting point of silicon.

20 Claims, 6 Drawing Sheets

LAYERED SUBSTRATE FOR MICROELECTRONIC DEVICES

RELATED APPLICATIONS

This application is a national stage filing under 35 U.S.C. § 371 of International Patent Application No. PCT/US2016/025723, filed Apr. 1, 2016, which is hereby incorporated by reference herein in its entirety.

BACKGROUND

Metal-oxide-semiconductor (MOS) and tunnel field-effect transistor (TFET) devices in state of the art integration require high quality silicon for device fabrication. MOS and TFET devices are built on silicon substrates. Silicon substrates are a thin slice of semiconductor material such as a crystalline silicon used in electronics for the fabrication of integrated circuits. Microelectronic devices are built in and over (on) the silicon substrate and undergo many microfabrication process steps such as doping or ion implantation, etching, deposition, and photolithographic patterning. Availability of high quality silicon may limit the size of substrates and thermal processing conditions.

DETAILED DESCRIPTION

Described herein are systems and methods of a layered substrate. The layered substrate can comprise a core and a coating layer. The core can be comprised of graphite or quartz and the coating layer can comprise a coating layer that surrounds the core to provide a protection from corrosive environments. In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

Implementations of the embodiments may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present embodiments.

A plurality of transistors, such as metal-oxide-semiconductor field-effect transistors (MOSFET or simply MOS transistors), may be fabricated on the substrate. In various implementations of the embodiments, the MOS transistors may be planar transistors, nonplanar transistors, or a combination of both. Nonplanar transistors include FinFET transistors such as double-gate transistors and tri-gate transistors, and wraparound or all-around gate transistors such as nanoribbon and nanowire transistors. Although the implementations described herein may illustrate only planar transistors, it should be noted that the embodiments may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer. Further metal layers may be included for other purposes, such as a barrier layer.

For a PMOS silicon transistor, for example, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. Other semiconducting materials may be employed and optimal gate electrodes for those may be different.

In some implementations of the embodiments, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well-known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well-known in the art, source and drain regions are formed within the substrate adjacent to the gate stack of each MOS transistor. The source and drain regions are generally formed using either an implantation/diffusion process or an etching/deposition process. In the former silicon based example process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon-germanium or silicon-carbon alloys. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 1:
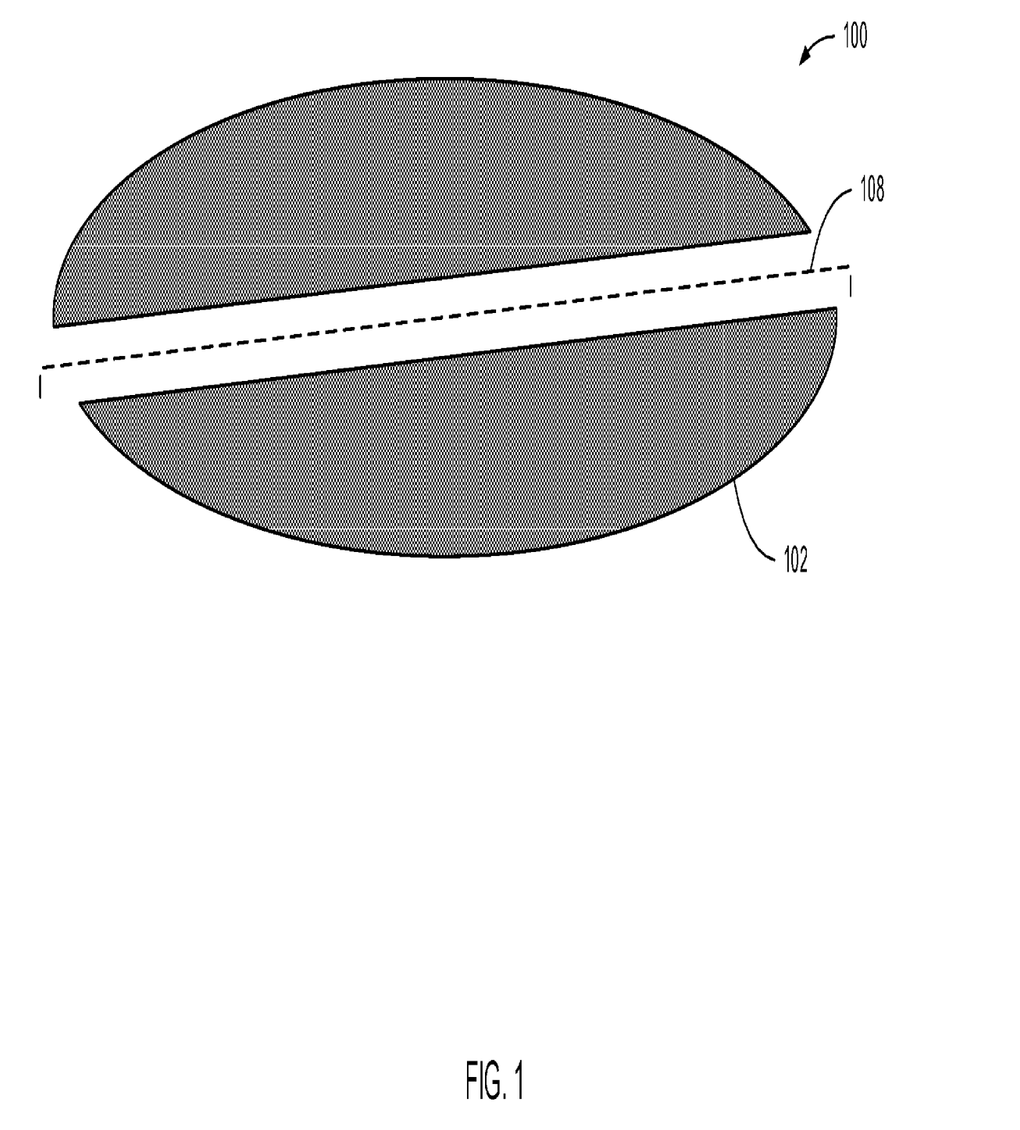
FIG. 1 is a diagram of a layered substrate according to one embodiment.

FIG. 1 is a diagram of a layered substrate according to one embodiment. A substrate 100 can be layered using a plurality of materials. The substrate 100 is comprised of a core and a coating layer 102. FIG. 1 also shows a cutline 108 which is used for reference in FIG. 2.

Figure 2:
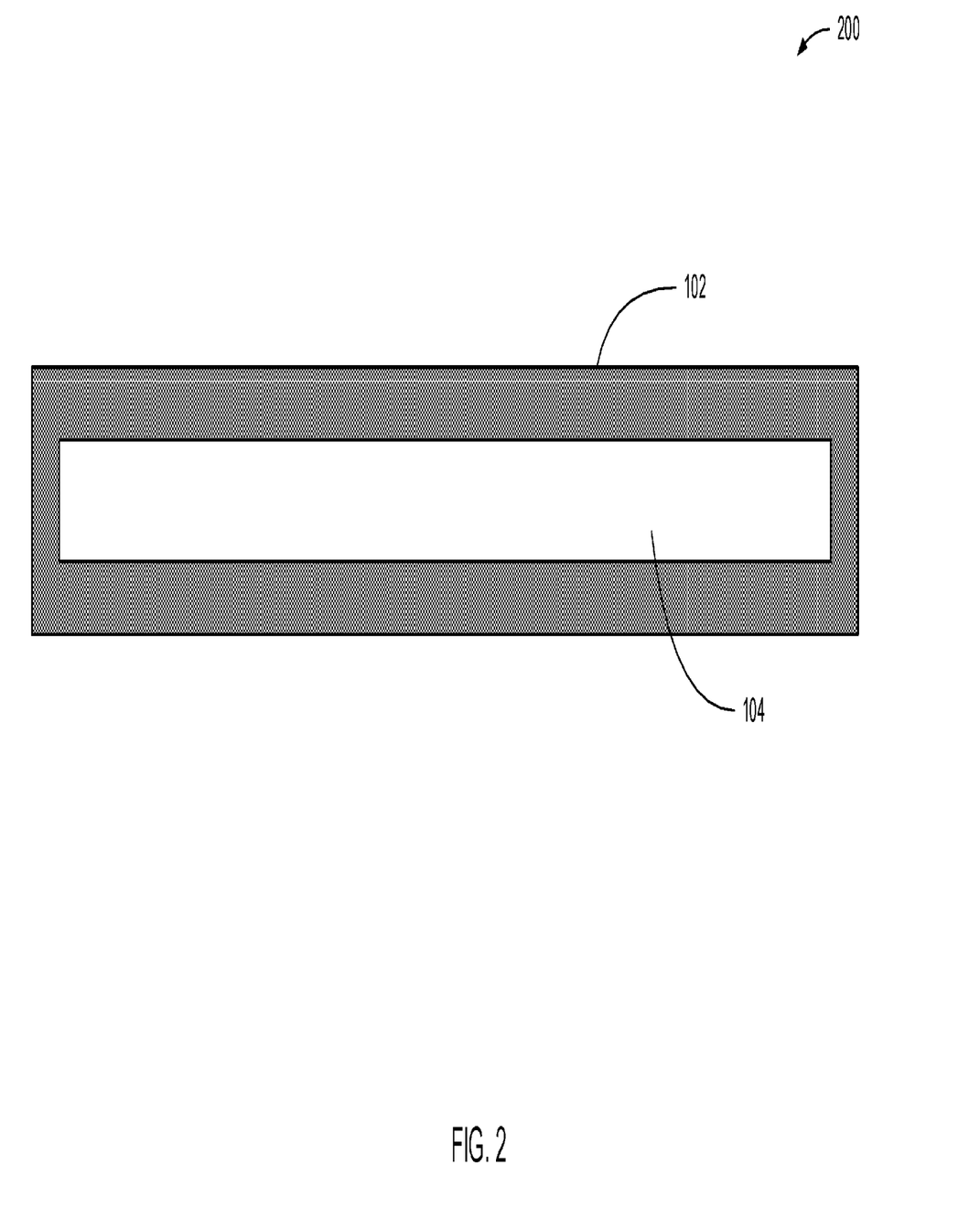
FIG. 2 is a cross-sectional view of a layered substrate according to one embodiment.

As used herein, the core can comprise of a material that is surrounded by the coating layer 102. The core is not shown in FIG. 1 as the core is surrounded by the coating layer 102. FIG. 2 shows an example of the core 204. The coating layer 102 can comprise at least one coating layer. For example, the coating layer 102 can comprise a plurality of coating layers.

MOS and TFET devices, among other types of devices, transition to two-dimensional (2D) planar materials including for example graphene, MoS2, and MXenes, among other types of 2D planar materials. The 2D planar materials can be 2D semiconductors fabricated from ordered crystalline materials with etched intermediate layers). The MOS and TFET devices, among other types of devices, may also comprise certain classes of spinfets.

The 2D materials may require high temperature processing that is not compatible with silicon (Si) substrates (e.g., wafers) from the standpoint of melting temperature and Si contamination of the desired channel materials of microelectronic devices. For example, microelectronic devices formed using 2D materials may be fabricated using temperatures that are near or above a melting point of Si. As such, in a fabrication process of a device using 2D materials, a temperature which is near or above the melting point of Si may be used to form the 2D material resulting in mechanical deformation of, and/or gross diffusion from a substrate comprised of Si and/or the 2D material.

In a number of embodiments, the substrate 100 may have a higher melting point than the melting point of Si. The melting point of the substrate 100 is higher than a melting point of Si due to the use of graphite or quartz as a core and the coating material used as the coating layer 102. That is, both the core material (e.g., graphite or quartz) and the coating materials can have melting points that are higher than the melting point for Si.

The substrate 100 may be chemically stable. That is, the substrate 100 may resist contamination of the desired channel material of microelectronic devices and/or may resist corrosion in the processing ambient. For example, in a fabrication process of a microelectronic device comprising 2D materials that uses a temperature that is above the melting point of Si, the substrate 100 does not melt, the substrate 100 does not contaminate the microelectronic device, and/or the microelectronic device does not contaminate the substrate 100.

The core's purpose is to minimize thermal expansion coefficient and to have excellent thermal properties. As used herein, excellent thermal properties include a high thermal absorption and/or a low coefficient of thermal expansion.

A core material can be one of a plurality of materials that have a high thermal absorption and/or a low coefficient of thermal expansion. For example, the core material can be graphite. Graphite has a negative coefficient of thermal expansion. Thermal expansion is the tendency of a matter to change shape, area, and/or volume in response to a change in temperature through heat transfer. The degree of expansion divided by the change in temperature is called the coefficient of thermal expansion. That is, the coefficient of thermal expansion describes how the substrate 100 changes with a change in temperature.

Another example of a core material is quartz. Quartz has a near zero thermal expansion coefficient. As used herein, a near zero thermal expansion coefficient comprises a thermal expansion coefficient that is less than 3. In a number of embodiments, a near zero thermal expansion coefficient comprises a thermal expansion coefficient that is less than 5. For example, a near zero thermal expansion coefficient can be a thermal expansion coefficient equal to −1.

Thermal absorption may play an important part in selecting a core material. For example, graphite may be selected over quartz in part due to graphite having a higher thermal absorption than the thermal absorption of quart.

The core material can be alloyed or doped with a different core material to further tune the coefficient of thermal expansion of the core and/or the core material. For example, the core material can be doped and/or alloyed to increase the coefficient of thermal expansion or decrease the coefficient of thermal expansion.

The coefficient of thermal expansion of the core and/or the core material can also be altered by altering the thickness of the core material. The coefficient of thermal expansion of the core and/or the core material can further be altered by a choice of the core material. In a number of examples, the type of core material, whether the core material is doped or alloyed, and the thickness of the core material can be selected such that the coefficient of thermal expansion of the core and/or the material is equal to zero.

If a core and/or core material has a coefficient of thermal expansion equal to zero, then the warping associated with rapid heating and cooling of the substrate 100 would be small to the point of being negligible. Negligible warping of the substrate 100 when rapidly heated and cooled is critical in rapid thermal processing and especially so for substrates with a size of 12 inches or larger. Substrates that have a size of 12 inches or larger may be commonly known as 300 mm wafers.

The coating layer 102 uses a high temperature coating material. The high temperature coating material can be a coating material that has a melting point that is greater than the melting point of Si. The high temperature coating material can also be a coating material that has a melting point that is greater than 1500 degrees Celsius.

The coating layer 102 can also have an extreme resistance to corrosion and a resistance to diffusion to and from overlayers. That is, the coating layer 102 can prevent material leaks, material contamination, the exposure of the core material to an overlayer (e.g., microelectronic device), and/or a chemical reaction with an overlayer.

The coating layer 102 can be a single coating layer or a plurality of coating layers. To produce the coating layer 102, each of the plurality of coating layers can be applied on the core successively. That is, any given coating layer from the plurality of coating layers can be applied on the core at a time.

A coating material can be at least any of silicon carbide (SiC), silicon monotride (SiN), aluminum oxide (Al2O3), boron carbide (BC), zirconium dioxide (ZrO2), and titanium dioxide (TiO2), among others. As such, each of the coating layers that comprise the coating layer 102 can consist of a coating material that is comprised of any one of SiC, SiN, Al2O3, BC, ZrO2, and TiO2.

The outer layer of the coating layers 102 may have an amorphous microstructure. An amorphous microstructure is a microstructure that lacks a crystal structure. The amorphous surface (e.g., outer layer) structure can be used for products requiring crystalline surfaces via an optional substrate bonding step. The outer layer from the coating layer 102 can also be compatible with a 2D semiconductor layer or a polycrystalline semiconductor layers even in its native amorphous state.

A benefit of creating the substrate 100 using a core and a coating layer is that the core material and/or the coating materials may be cost-effective as compared to silicon. For example, graphite may cost less than silicon. Graphite may also be more readily available than silicon and the advantage become more pronounced at larger substrate sizes.

FIG. 2 is a cross-sectional view of a layered substrate according to one embodiment. FIG. 2 includes a substrate 200, a coating layer 202, and a core 204. The cross-sectional view of the layered substrate is taken along the cutline 108.

Although FIG. 2 shows the proportions of the coating layer 202 and the core 204 as being roughly equal, it is to be understood that the proportions shown in FIGS. 1, 2, 3, 4, 5, and 6 are shown for illustrative purposes and different proportions may be used in a number of embodiments. For example, the substrate 200 may predominantly consist of the core 204 and the coating layers 202 may have a thickness of 1 to 25 micrometer (μm). In some embodiments, the core 204 can comprise 90% of the substrate 200 and the coating layer 202 can comprise 10% of the substrate 200.

The substrate 200 can have a plurality of sizes. For example, the substrate 200 can be 8 to 12 inches in diameter, 12 to 18 inches in diameter, or 18 to 24 inches in diameter. The substrate 200 can be cylindrical in shape with a total thickness of 0.75 mm to 2 mm, for example.

While the size of the substrate 200 may vary, the thickness of the coating layer 202 may remain constant. For example, the coating layer 202 may be 25 μm in thickness regardless of the thickness of the core 204.

In some embodiments, the coating layer 202 does not uniformly surround the core 204. For example, the substrate 200 may have beveled edges. The beveled edges may be formed at the time of depositing the coating layer 202 and/or the beveled edges may be removed after the coating layer 202 is deposited. The beveled edges may be expressed in the coating layer 202 without being expressed in the core 204.

Figure 3:
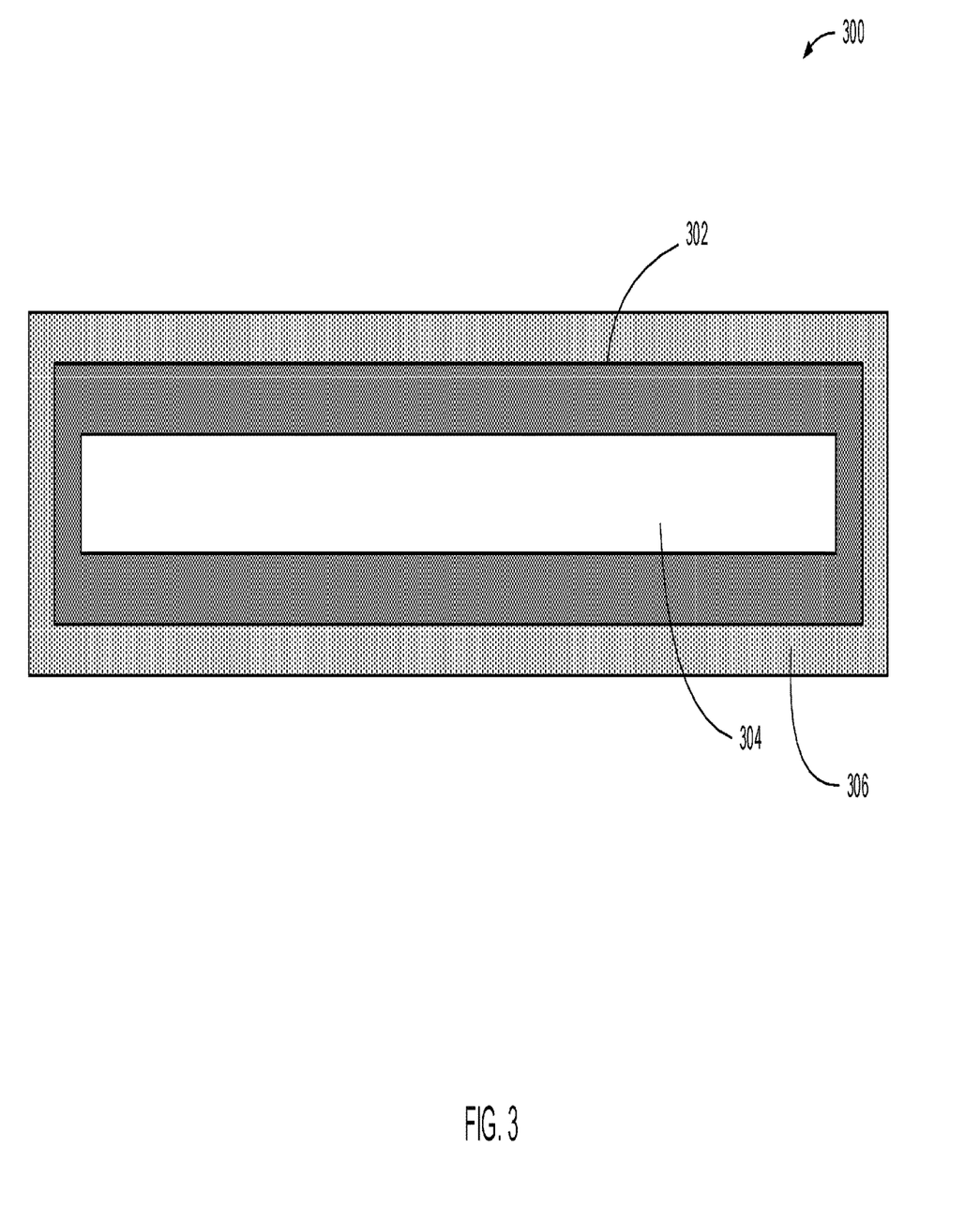
FIG. 3 is a cross-sectional view of a layered substrate according to one embodiment.

FIG. 3 is a cross-sectional view of a layered substrate according to one embodiment. The cross-sectional view is created by cutting the substrate 100 in FIG. 1 along the cutline 108. FIG. 3 includes a substrate 300. The substrate 300 can comprise a core 304. The substrate 300 can also comprise a coating layer 302 and a coating layer 306. The coating layer 302 can be an inner coating layer and the coating layer 306 can be an outer coating layer.

The core 304 can be formed before the coating layers 302 and 306 are deposited. The coating layer 302 can be formed to surround the core 304 before the coating layer 306 is formed to surround the coating layer 302 and the core 304.

The coating layer 302 can comprise a first coating material and the coating layer 306 can comprise a second coating material. The first coating material and the second coating material can be different materials and/or a same material.

The first coating material and the second coating material can have different properties and/or the coating layer 302 and the coating layer 306 can have different properties. For example, the coating layer 306 can have an amorphous microstructure while the coating layer 302 does not have an amorphous microstructure.

The coating layer 302 and the coating layer 306 can have a total thickness of 1 to 25 μm or each of the coating layers 302 and 306 can have a thickness of 1 to 25 μm.

Figure 4:
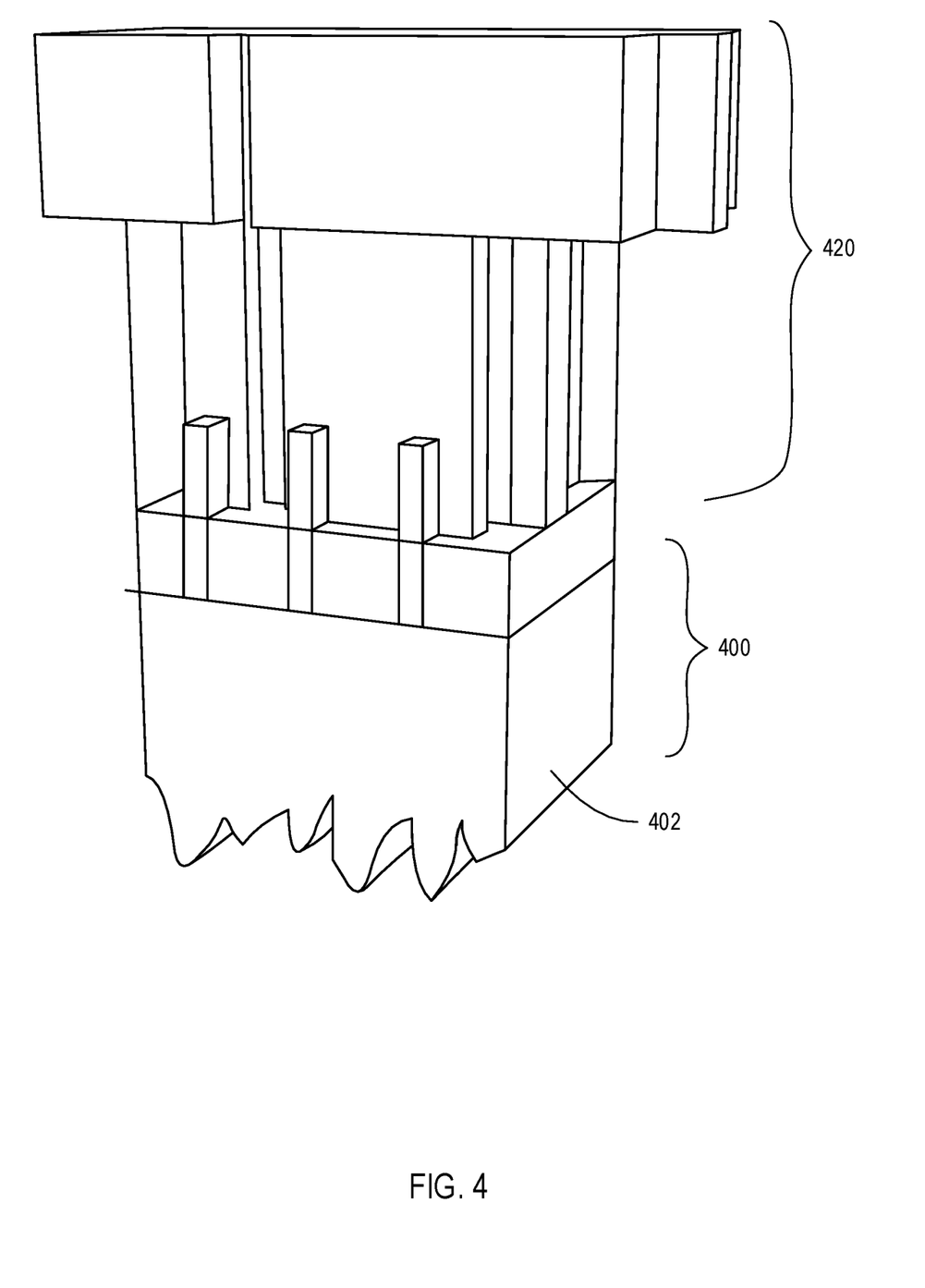
FIG. 4 is a cross-sectional view of an integrated circuit according to one embodiment.

FIG. 4 is a cross-sectional view of an integrated circuit according to one embodiment. An integrated circuitry 420 can be part of a microelectronic device. The integrated circuitry 420 can include a 2D material. The integrated circuitry 420 can be formed on a substrate 400 through a deposition process and/or a different process.

The substrate 400 can comprise a core and at least a coating layer 402. The core and/or a plurality of the coating layers including the coating layer 402 can be at least partially removed from the integrated circuitry 420. For example, the core and a portion of the coating layer 402 can be removed from the integrated circuitry 420 after the integrated circuitry 420 is fully formed on the substrate 400.

The integrated circuitry 420 can be coupled to a plurality of other computing devices and/or a substrate to form a computing device. The coating layer 402 may be attached to the integrated circuitry 420 when the integrated circuitry 420 is coupled to the computing device.

Figure 5:
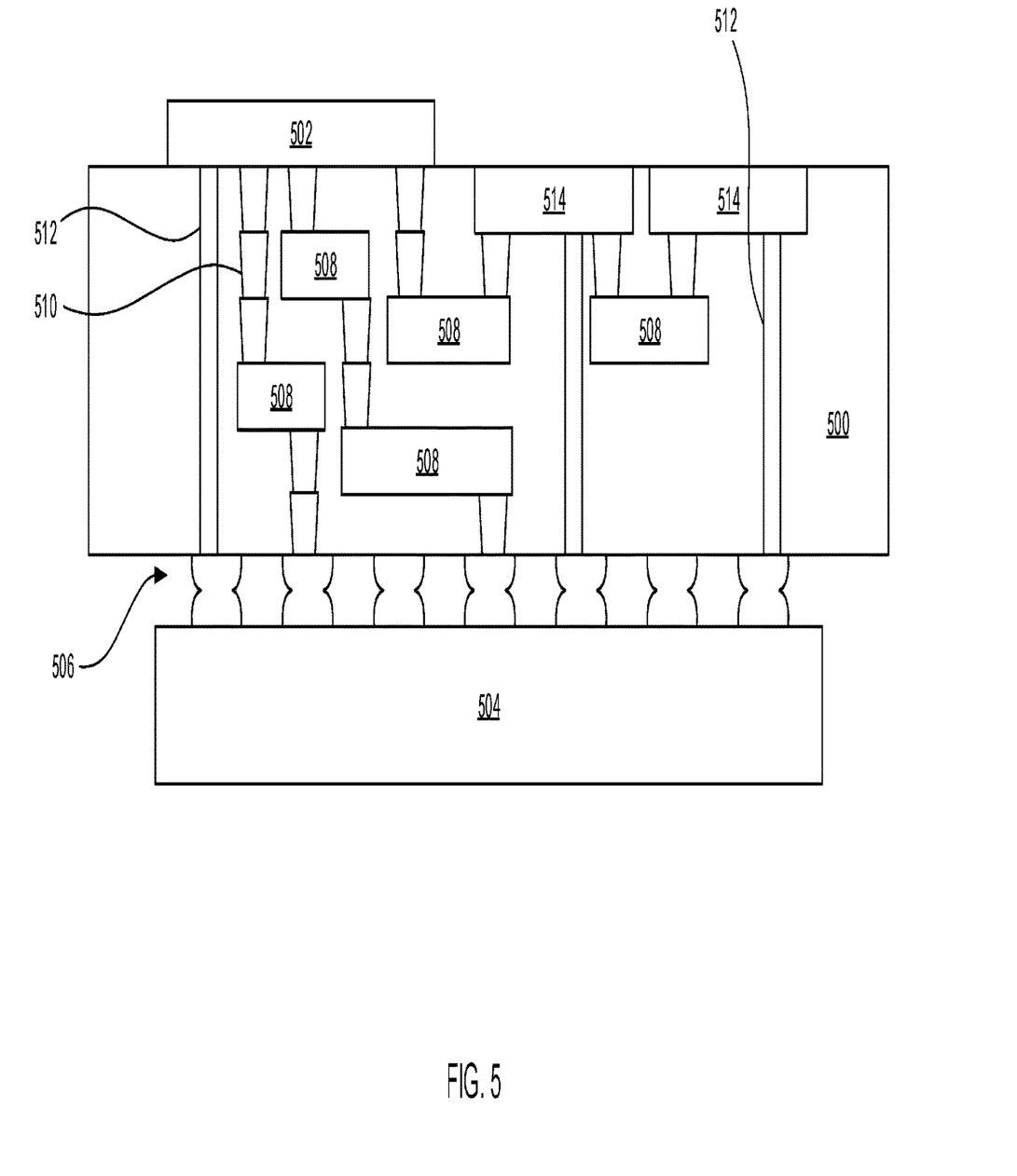
FIG. 5 is an interposer implementing one or more embodiments.

FIG. 5 illustrates an interposer 500 that includes one or more embodiments. The interposer 500 is an intervening substrate used to bridge a first substrate 502 to a second substrate 504. The first substrate 502 may be, for instance, an integrated circuit die. The second substrate 504 may be, for instance, a memory module, a computer motherboard, or another integrated circuit die. Generally, the purpose of the interposer 500 is to spread a connection to a wider pitch or to reroute a connection to a different connection. For example, the interposer 500 may couple an integrated circuit die to a ball grid array (BGA) 506 that can subsequently be coupled to the second substrate 504. In some embodiments, the first and second substrates 502/504 are attached to opposing sides of the interposer 500. In other embodiments, the first and second substrates 502/504 are attached to the same side of the interposer 500. And in further embodiments, three or more substrates are interconnected by way of the interposer 500.

The interposer 500 may be formed of an epoxy resin, a fiberglass-reinforced epoxy resin, a ceramic material, or a polymer material such as polyimide. In further implementations, the interposer 500 may be formed of alternate rigid or flexible materials that may include the same materials described above for use in a semiconductor substrate, such as silicon, germanium, and other group III-V and group IV materials.

The interposer 500 may include metal interconnects 508 and vias 510, including, but not limited to, through-silicon vias (TSVs) 512. The interposer 500 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 500.

In accordance with embodiments, apparatuses or processes disclosed herein may be used in the fabrication of the interposer 500.

Figure 6:
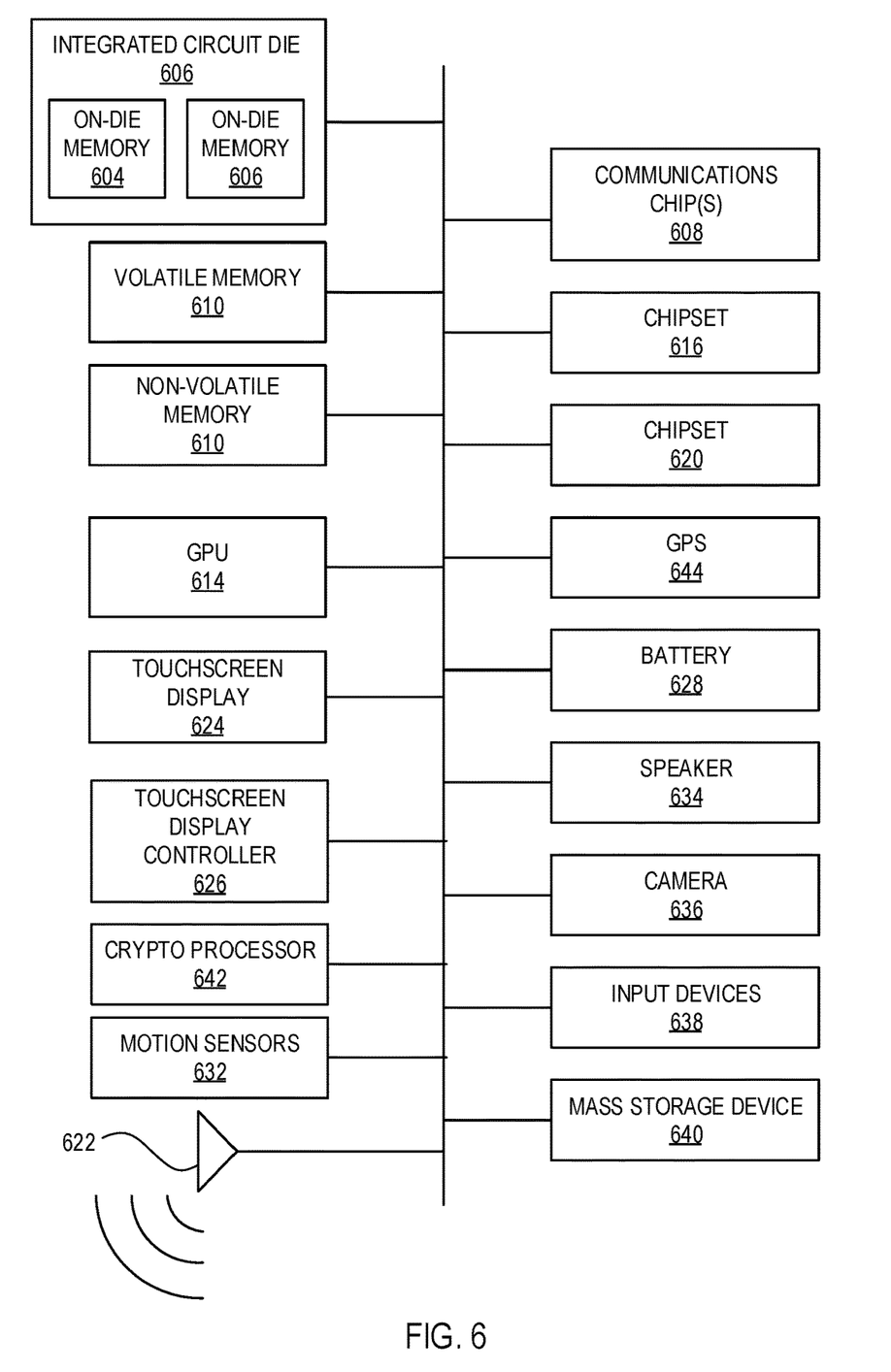
FIG. 6 is a computing device built in accordance with an embodiment.

FIG. 6 illustrates a computing device 600 in accordance with one. The computing device 600 may include a number of components. In one embodiment, these components are attached to one or more motherboards. In an alternate embodiment, some or all of these components are fabricated onto a single system-on-a-chip (SoC) die, such as an SoC used for mobile devices. The components in the computing device 600 include, but are not limited to, an integrated circuit die 602 and at least one communications logic unit 608. In some implementations the communications logic unit 608 is fabricated within the integrated circuit die 602 while in other implementations the communications logic unit 608 is fabricated in a separate integrated circuit chip that may be bonded to a substrate or motherboard that is shared with or electronically coupled to the integrated circuit die 602. The integrated circuit die 602 may include a processor (e.g., central processing unit (CPU) 604 as well as an on-die memory 606, often used as cache memory, that can be provided by technologies such as embedded DRAM (eDRAM), SRAM, or spin-transfer torque magnetic random-access memory (STT-MRAM).

The computing device 600 may include other components that may or may not be physically and electrically coupled to the motherboard or fabricated within an SoC die. These other components include, but are not limited to, a volatile memory 610 (e.g., DRAM), a non-volatile memory 612 (e.g., ROM or flash memory), a graphics processing unit (GPU) 614, a digital signal processor (DSP) 616, a crypto processor 642 (e.g., a specialized processor that executes cryptographic algorithms within hardware), a chipset 620, at least one of an antenna 622 (in some implementations two or more antenna may be used), a display or a touchscreen display 624, a touchscreen display controller 626, a battery 628 or other power source, a power amplifier (not shown), a voltage regulator (not shown), a global positioning system (GPS) device 644, a motion coprocessor or sensor 632 (that may include an accelerometer, a gyroscope, and a compass), a microphone (not shown), a speaker 634, a camera 636, user input devices 638 (such as a keyboard, mouse, stylus, and touchpad), and a mass storage device 640 (such as hard disk drive, compact disk (CD), digital versatile disk (DVD), and so forth). The computing device 600 may incorporate further transmission, telecommunication, or radio functionality not already described herein. In some implementations, the computing device 600 includes a radio that is used to communicate over a distance by modulating and radiating electromagnetic waves in air or space. In further implementations, the computing device 600 includes a transmitter and a receiver (or a transceiver) that is used to communicate over a distance by modulating and radiating electromagnetic waves in air or space.

The communications logic unit 608 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 608 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, and derivatives thereof, as well as any other wireless protocols that are designated as 3G, 4G, 5G, and beyond. The computing device 600 may include a plurality of communications logic units 608. For instance, a first communications logic unit 608 may be dedicated to shorter range wireless communications such as Wi-Fi, NFC, and Bluetooth and a second communications logic unit 608 may be dedicated to longer range wireless communications such as GPS, EDGE, GPRS, CDMA, WiMAX, LTE, Ev-DO, and others.

The processor 604 of the computing device 600 includes one or more devices that are formed on a layered substrate that comprises a core and a number of coating layers. In a number of embodiments, the processor 604 may be formed on a layered substrate. The one or more devices and/or the processor 604 can comprise a coating layer and/or a coating material that has been at least partially removed from the one or more devices and/or the processor 604. At least a portion of the one or more devices and/or the processor 604 may comprise a 2D material. The term "processor" may refer to any device or portion of a device that processes electronic data from registers and/or memory to transform that electronic data into other electronic data that may be stored in registers and/or memory.

The communications logic unit 608 may also include one or more devices, such as transistors, that are formed in accordance with embodiments. For example, the communications logic unit 608, the one or more devices, and/or the transistors may be formed in a layered substrate comprising a core and a coating layer. At least a portion of the core and/or the coating layer may be removed from the communications logic unit 608, the one or more devices, and/or the transistors. The communications logic unit 608, the one or more devices, and/or the transistors may be coupled to at least a portion of the coating layer that was not removed. The communications logic unit 608, the one or more devices, and/or the transistors may comprise a 2D material.

In further embodiments, another component housed within the computing device 600 may contain one or more devices that were also formed on a layered substrate as described above. At least a portion of the core and/or the coating layer may be removed from the one or more devices. The one or more devices may be coupled to at least a portion of the coating layer that was not removed. The one or more devices may comprise a 2D material.

In various embodiments, the computing device 600 may be a laptop computer, a netbook computer, a notebook computer, an ultrabook computer, a smartphone, a dumbphone, a tablet, a tablet/laptop hybrid, a personal digital assistant (PDA), an ultramobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

The above description of illustrated implementations of the embodiments, including what is described in the Abstract, is not intended to be exhaustive or to limit the embodiments to the precise forms disclosed. While specific implementations of, and examples for, the embodiments are described herein for illustrative purposes, various equivalent modifications are possible within the scope of the embodiments, as those skilled in the relevant art will recognize.

Example Embodiments

Example 1 is a substrate for a microelectronic device, the substrate comprising a core comprising a core material and a coating layer comprising a coating material that surrounds the core, wherein the coating material has a melting point that is greater than a melting point of silicon.

In Example 2, the subject matter of Example 1, or any of the Examples described herein wherein the melting point of the coating material is greater than 1500 degrees Celsius.

In Example 3, the subject matter of Example 1 or any of the Examples described herein wherein the coating layer comprises two or more layers of a plurality of coating materials including the coating material.

In Example 4, the subject matter of Example 1 or any of the Examples described herein wherein the coating material is chemically resistant to corrosion.

In Example 5, the subject matter of Example 1 or any of the Examples described herein wherein the coating material does not diffuse to and from over layers.

In Example 6, the subject matter of Example 1 or any of the Examples described herein wherein the coating material comprises at least one of SiC, SiN, Al2O3, BC, ZrO2, and TiO2.

In Example 7, the subject matter of Example 1 or any of the Examples described herein wherein the coating layer includes an outer layer that comprises an amorphous microstructure.

In Example 8, the subject matter of Example 1 or any of the Examples described herein wherein the coating material is compatible with a two-dimensional (2D) semiconductor layer.

In Example 9, the subject matter of Example 1 or any of the Examples described herein wherein the core material has a negative coefficient of thermal expansion.

In Example 10, the subject matter of Example 1 or any of the Examples described herein wherein the core material has a coefficient of thermal expansion that is near zero.

In Example 11, the subject matter of Example 1 or any of the Examples described herein wherein the core material is alloyed.

In Example 12, the subject matter of Example 1 or any of the Examples described herein wherein the core material is doped.

Example 13 is a method for forming a substrate for a microelectronic device comprising forming a substrate using a core material, applying a first layer of a first coating material, and applying at least a second layer of one of a plurality of second coating materials wherein an the first layer and the second layer have a melting point that is greater than a melting point of silicon.

In Example 14, the subject matter of Example 13 or any of the Examples described herein wherein the first coating material and the plurality of second coating materials include at least one of SiC, SiN, Al2O3, BC, ZrO2, and TiO2.

In Example 15, the subject matter of Example 13 or any of the Examples described herein wherein at least the second layer includes a plurality of layers.

In Example 16, the subject matter of Example 15 or any of the Examples described herein wherein the plurality of layers are applied successively.

In Example 17, the subject matter of Example 13 or any of the Examples described herein wherein the substrate comprises 90% of the core material and 10% of the first layer and the at least the second layer.

In Example 18, the subject matter of Example 13 or any of the Examples described herein wherein the core material is at least one of graphite and quartz.

In Example 19, the subject matter of Example 13 or any of the Examples described herein wherein the melting point of the coating material is greater than 1500 degrees Celsius.

In Example 20, the subject matter of Example 13 or any of the Examples described herein wherein at least one of the first coating material and the second coating material is chemically resistant to corrosion.

In Example 21, the subject matter of Example 13 or any of the Examples described herein wherein at least one of the first coating material and the second coating material does not diffuse to and from over layers.

In Example 22, the subject matter of Example 13 or any of the Examples described herein wherein at least one of the first layer and the second layer comprises an outer layer that comprises an amorphous microstructure.

In Example 23, the subject matter of Example 13 or any of the Examples described herein wherein at least one of the first coating material and the second coating material is compatible with a two-dimensional (2D) semiconductor layer.

In Example 24, the subject matter of Example 13 or any of the Examples described herein wherein the core material has a negative coefficient of thermal expansion.

In Example 25, the subject matter of Example 13 or any of the Examples described herein wherein the core material has a coefficient of thermal expansion that is near zero.

In Example 26, the subject matter of Example 13 or any of the Examples described herein wherein the core material is alloyed.

In Example 27, the subject matter of Example 13 or any of the Examples described herein wherein the core material is doped.

Example 28 is an integrated circuit, comprising a coating material that has a melting point that is greater than a melting point of silicon and circuitry formed on or in the coating material, wherein the circuitry comprises at least a two-dimensional (2D) semiconductor layer.

In Example 29, the subject matter of Example 28 or any of the Examples described herein wherein a layer of the coating material has been at least partially removed from the circuitry.

In Example 30, the subject matter of Example 29 or any of the Examples described herein wherein the layer comprises a plurality of layers.

In Example 31, the subject matter of Example 28 or any of the Examples described herein wherein the coating material include at least one of SiC, SiN, Al2O3, BC, ZrO2, and TiO2.

In Example 32, the subject matter of Example 28 or any of the Examples described herein wherein the melting point of the coating material is greater than 1500 degrees Celsius.

In Example 33, the subject matter of Example 28 or any of the Examples described herein wherein the coating material is chemically resistant to corrosion.

In Example 34, the subject matter of Example 28 or any of the Examples described herein wherein the coating material does not diffuse to and from the 2D semiconductor layer.

In Example 35, the subject matter of Example 28 or any of the Examples described herein wherein the coating material comprises an outer layer that comprises an amorphous microstructure.

In Example 36, the subject matter of Example 28 or any of the Examples described herein wherein the coating material is compatible with the 2D semiconductor layer.

Example 37 is a computing device comprising a processor, a memory unit capable of storing data, a graphics processing unit, an antenna within the computing device, a display on the computing device, a battery within the computing device, a power amplifier within the processor, and a voltage regulator within the processor, wherein the processor comprises circuitry formed in or on a substrate, wherein the processor is at least partially comprised of a two-dimensional (2D) planar material and wherein the substrate includes at least one of SiC, SiN, Al2O3, BC, ZrO2, and TiO2.

In Example 38, the subject matter of Example 37 or any of the Examples described herein wherein the substrate has been partially ground from the processor.

In Example 39, the subject matter of Example 37 or any of the Examples described herein wherein the substrate includes a coating material of a coating layer.

In Example 40, the subject matter of Example 39 or any of the Examples described herein wherein the coating material has been at least partially removed from the processor.

In Example 41, the subject matter of Example 37 or any of the Examples described herein wherein a melting point of the substrate is greater than 1500 degrees Celsius.

In Example 42, the subject matter of Example 37 or any of the Examples described herein wherein the substrate is chemically resistant to corrosion.

In Example 43, the subject matter of Example 37 or any of the Examples described herein wherein the substrate does not diffuse to and from the 2D planar material.

In Example 44, the subject matter of Example 37 or any of the Examples described herein wherein the substrate comprises an outer layer that comprises an amorphous microstructure.

Various techniques, or certain aspects or portions thereof, may take the form of program code (i.e., instructions) embodied in tangible media, such as floppy diskettes, CD-ROMs, hard drives, a non-transitory computer readable storage medium, or any other machine-readable storage medium wherein, when the program code is loaded into and executed by a machine, such as a computer, the machine becomes an apparatus for practicing the various techniques. In the case of program code execution on programmable computers, the computing device may include a processor, a storage medium readable by the processor (including volatile and non-volatile memory and/or storage elements), at least one input device, and at least one output device. The volatile and non-volatile memory and/or storage elements may be a RAM, an EPROM, a flash drive, an optical drive, a magnetic hard drive, or another medium for storing electronic data. The eNB (or other base station) and UE (or other mobile station) may also include a transceiver component, a counter component, a processing component, and/or a clock component or timer component. One or more programs that may implement or utilize the various techniques described herein may use an application programming interface (API), reusable controls, and the like. Such programs may be implemented in a high-level procedural or an object-oriented programming language to communicate with a computer system. However, the program(s) may be implemented in assembly or machine language, if desired. In any case, the language may be a compiled or an interpreted language, and combined with hardware implementations.

It should be understood that many of the functional units described in this specification may be implemented as one or more components, which is a term used to more particularly emphasize their implementation independence. For example, a component may be implemented as a hardware circuit comprising custom very large scale integration (VLSI) circuits or gate arrays, off-the-shelf semiconductors such as logic chips, transistors, or other discrete components. A component may also be implemented in programmable hardware devices such as field programmable gate arrays, programmable array logic, programmable logic devices, or the like.

Components may also be implemented in software for execution by various types of processors. An identified component of executable code may, for instance, comprise one or more physical or logical blocks of computer instructions, which may, for instance, be organized as an object, a procedure, or a function. Nevertheless, the executables of an identified component need not be physically located together, but may comprise disparate instructions stored in different locations that, when joined logically together, comprise the component and achieve the stated purpose for the component.

Indeed, a component of executable code may be a single instruction, or many instructions, and may even be distributed over several different code segments, among different programs, and across several memory devices. Similarly, operational data may be identified and illustrated herein within components, and may be embodied in any suitable form and organized within any suitable type of data structure. The operational data may be collected as a single data set, or may be distributed over different locations including over different storage devices, and may exist, at least partially, merely as electronic signals on a system or network. The components may be passive or active, including agents operable to perform desired functions.

Reference throughout this specification to "an example" means that a particular feature, structure, or characteristic described in connection with the example is included in at least one embodiment. Thus, appearances of the phrase "in an example" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on its presentation in a common group without indications to the contrary. In addition, various embodiments and examples may be referred to herein along with alternatives for the various components thereof. It is understood that such embodiments, examples, and alternatives are not to be construed as de facto equivalents of one another, but are to be considered as separate and autonomous representations of embodiments.

Although the foregoing has been described in some detail for purposes of clarity, it will be apparent that certain changes and modifications may be made without departing from the principles thereof. It should be noted that there are many alternative ways of implementing both the processes and apparatuses described herein. Accordingly, the present embodiments are to be considered illustrative and not restrictive, and the embodiments is not to be limited to the details given herein, but may be modified within the scope and equivalents of the appended claims.

The invention claimed is:

1. A substrate for a microelectronic device, the substrate comprising:
    a core comprising a core material;
    a coating layer comprising a coating material that surrounds the core, wherein the coating material has a melting point that is greater than a melting point of silicon; and
    a two-dimensional (2D) semiconductor layer over and surrounding the coating layer.

2. The substrate of claim 1, wherein the melting point of the coating material is greater than 1500 degrees Celsius.

3. The substrate of claim 1, wherein the coating layer comprises two or more layers of a plurality of coating materials including the coating material.

4. The substrate of claim 1, wherein the coating material is chemically resistant to corrosion.

5. The substrate of claim 1, wherein the coating material does not diffuse to and from over layers.

6. The substrate of claim 1, wherein the coating material comprises at least one of SiC, SiN, Al2O3, BC, ZrO2, and TiO2.

7. The substrate of claim 1, wherein the coating layer includes an outer layer that comprises an amorphous microstructure.

8. The substrate of claim 1, wherein the core material has a negative coefficient of thermal expansion.

9. The substrate of claim 1, wherein the core material has a coefficient of thermal expansion that is near zero.

10. The substrate of claim 1, wherein the core material is alloyed.

11. The substrate of claim 1, wherein the core material is doped.

12. A method for forming a substrate for a microelectronic device comprising:
    forming a substrate using a core material;
    applying a first layer of a first coating material;
    applying at least a second layer of one of a plurality of second coating materials wherein an the first layer and the second layer have a melting point that is greater than a melting point of silicon; and
    forming a two-dimensional (2D) semiconductor layer over and surrounding the second layer of the one of the plurality of second coating materials.

13. The method of claim 12, wherein the first coating material and the plurality of second coating materials include at least one of SiC, SiN, Al2O3, BC, ZrO2, and TiO2.

14. The method of claim 12, wherein the at least the second layer includes a plurality of layers.

15. The method of claim 14, wherein the plurality of layers are applied successively.

16. The method of claim 12, wherein the substrate comprises 90% of the core material and 10% of the first layer and the at least the second layer.

17. The method of claim 12, wherein the core material is at least one of graphite and quartz.

18. A substrate for a microelectronic device, the substrate comprising:
    a core comprising a core material, wherein the core material is selected from the group consisting of graphite and quartz;
    a coating layer comprising a coating material that surrounds the core, wherein the coating material is selected from the group consisting of SiC, SiN, Al2O3, BC, ZrO2, and TiO2; and
    a two-dimensional (2D) semiconductor layer over and surrounding the coating layer, wherein the two-dimensional (2D) semiconductor layer is selected from the group consisting of graphene and MoS2.

19. The substrate of claim 18, wherein the coating layer is amorphous.

20. The substrate of claim 18, further comprising a transistor device formed on the two-dimensional (2D) semiconductor layer.

* * * * *